United States Patent [19]

Sato et al.

[11] Patent Number: 4,969,257
[45] Date of Patent: Nov. 13, 1990

[54] TRANSFER SHEET AND PROCESS FOR MAKING A CIRCUIT SUBSTRATE

[75] Inventors: Takeshi Sato; Katsuya Fukase; Hirofumi Uchida; Kiyotaka Shimada, all of Nagano, Japan

[73] Assignee: Shinko Electric Industries, Co., Ltd., Nagano, Japan

[21] Appl. No.: 240,216

[22] Filed: Sep. 6, 1988

[30] Foreign Application Priority Data

Sep. 4, 1987 [JP] Japan ................... 62-222390
Dec. 5, 1987 [JP] Japan ................... 62-308343
Dec. 5, 1987 [JP] Japan ................... 62-308344

[51] Int. Cl.⁵ ........................... H05K 3/28
[52] U.S. Cl. ........................... 29/842; 29/848; 156/631; 427/96
[58] Field of Search ............. 29/848, 849, 852, 842; 156/630, 631, 634; 427/96

[56] References Cited

U.S. PATENT DOCUMENTS 3,372,474  3/1968  Polley et al. ................. 29/848
4,354,895  10/1982  Ellis ............................. 29/848 X
4,789,423  12/1988  Pelligrino ................... 156/631

FOREIGN PATENT DOCUMENTS

62-33493  2/1987  Japan .

Primary Examiner—Carl E. Hall
Attorney, Agent, or Firm—Staas & Halsey

[57] ABSTRACT

A transfer sheet includes an electrodeposited metal foil having a smooth surface and a rough surface attached to a heatproof flexible base sheet. Using such a transfer sheet, a circuit substrate is formed by etching the electrodeposited metal foil to form a circuit pattern, placing the transfer sheet into a cavity of a mold in such a manner that the rough surface of the circuit pattern faces an inside of the mold cavity, pouring a melting resin into the mold cavity to form a molded article, and peeling the transfer sheet from the molded article so that the circuit pattern remains on the resin base.

16 Claims, 8 Drawing Sheets

TRANSFER SHEET AND PROCESS FOR MAKING A CIRCUIT SUBSTRATE

BACKGROUND OF THE INVENTION

1. Field of the Invention

This invention relates to a technique for making a circuit substrate, such as a package for mounting a semiconductor device or chip. More particularly, it relates to a transfer sheet for forming an exact circuit pattern, and a process using such a transfer sheet for easily making a circuit substrate, particularly a circuit substrate having a three-dimensional electrical circuit.

2. Description of the Related Art

Conventionally, several kinds of circuit substrates are known in which a circuit pattern is formed on a resin base, such as a printed circuit board (PCB) or a pin-grid array (PGA) type package for mounting a semiconductor chip, and to form such a circuit pattern on the resin base, several methods such as plating, heat transfer, or the like are known.

A conventional heat transfer method, as disclosed for example, in Japanese Unexamined Patent Publication No. 60-121791, comprises the steps of: forming a circuit pattern of conductive paste on a base sheet by a screen-printing method; to form a transfer sheet on which the circuit pattern has been coated with an adhesive layer, and placing the transfer sheet in an injection mold; and thereafter injecting a heatproof, thermoplastic melting resin into a cavity of the injection mold to obtain a resin base having the circuit pattern formed thereon; and then peeling the base sheet from the resin base.

In another method of forming a circuit pattern on the base sheet, a metal film is first formed thereon by vaporization and then photoetched, to obtain a desired circuit pattern.

The above-mentioned method using a transfer sheet has the following disadvantages. Namely, it is difficult to form a precise circuit pattern by a screen-printing method. If the circuit pattern is formed of a conductive paste which consists of metal particles joined together with an organic binder, the resistance of the circuit is increased, and although a good heatproof material adapted for use as the resin base has been developed, such as an engineering plastic including glass fillers, the organic binder included in the conductive paste does not have good heatproof characteristics, and thus a circuit substrate thus obtained has a poor heat resistance.

On the other hand, if a circuit pattern is formed by photoetching the vaporized metal film, it is possible to obtain a precise pattern, but it takes a relatively long time to obtain a thick vaporized metal film, and a circuit having good wire-bonding characteristics can not be obtained if the vaporized metal film is thin.

SUMMARY OF THE INVENTION

Accordingly, an object of the present invention is to provide a transfer sheet for precisely forming a fine circuit pattern, and a process using such a transfer sheet for easily making a circuit substrate such as a three-dimensional electrical circuit.

According to the present invention, there is provided a transfer sheet able to be used for making a circuit substrate, comprising: a heatproof flexible base sheet and an electrodeposited metal foil having a smooth (or shiny) surface and a rough (or mat) surface provided with a large number of fine projections, attached to the base sheet in such a manner that the smooth surface of the electrodeposited metal foil is directly in contact with the base sheet and the electrodeposited metal foil is exfoliatively secured to the base sheet.

In another aspect of the present invention, there is provided a process for making a circuit substrate using a transfer sheet in which an electrodeposited metal foil, having a smooth surface and a rough surface provided with a large number of fine projections, is attached to a heatproof flexible base sheet in such a manner that the smooth surface of the electrodeposited metal foil is in contact with the base sheet and the electrodeposited metal foil is exfoliatively secured to the base sheet; the process comprising the following steps of:

etching the electrodeposited metal foil to form a circuit pattern on the base sheet of the transfer sheet;

placing the thus-formed transfer sheet into a cavity of a mold in such a manner that the rough surface of the circuit pattern faces the inside of the mold cavity;

pouring a melting resin into the mold cavity to form a molded article comprising a resin base to which the transfer sheet is attached; and, peeling the transfer sheet from the molded article so that the circuit pattern remains on the resin base.

According to the process of this invention, it is advantageous that the side walls of the circuit pattern of the molded article are buried in the resin, so that the adhering strength between the circuit pattern and the resin is enhanced.

DESCRIPTION OF THE PREFERRED EMBODIMENTS

Figure 1:
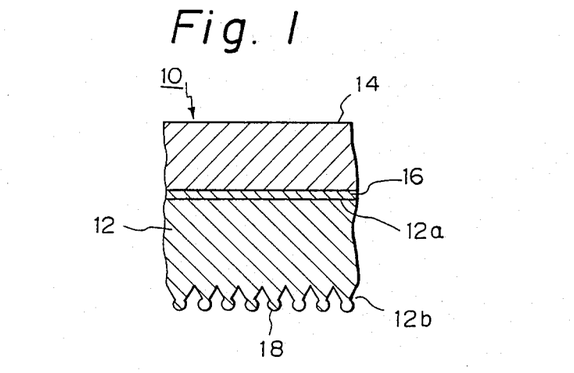
FIG. 1 is a schematic cross-sectional view of a transfer sheet for forming a circuit pattern according to the present invention.

Referring now to the drawings, wherein FIGS. 1–5 show a first embodiment of this invention, a transfer sheet 10 shown in FIG. 1 comprises an electrodeposited copper foil 12 having a smooth surface 12a and a rough surface 12b and attached to a base sheet 14 in such a manner that the smooth surface 12a is directly in contact with the base sheet 14 or in contact therewith via an exfoliating layer 16. The base sheet 14 is made of a heatproof flexible resin such as polyimide or the like.

The electrodeposited copper foil 12 is formed by an electrodepositing process comprising the steps of: forming a copper layer on a peripheral mirror surface of a drum-like electrode and exfoliating the copper layer from the drum-like electrode. Accordingly, the electrodeposited copper foil 12 thus obtained has one surface 12a which is as smooth as a mirror face and another surface on which electrolytes, i.e., copper particles, are accumulated to form a rough surface 12b. Copper oxide particles are then attached to the rough surface 12b, on which a barrier layer is further formed by plating with brass, zinc or the like, and the barrier layer is then subjected to various treatments, such as a rust preventing chromadizing process. Accordingly, the rough surface 12b is further roughened as mentioned above so that the rough surface 12b has, in an enlarged cross-section, a large number of fine projections 18 having enlarged tops.

Figure 2:
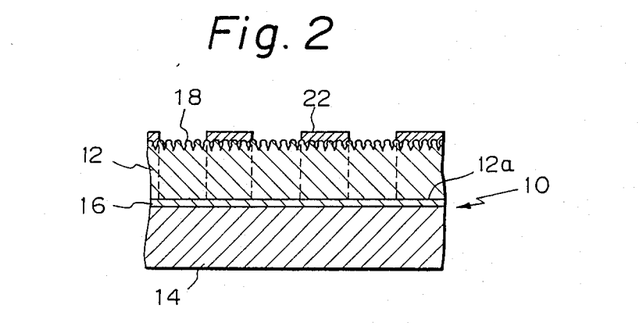
FIG. 2 is a cross-sectional view of a transfer sheet of this invention, on which the circuit pattern is formed by photoetching.

FIG. 2 shows the transfer sheet 10 according to the present invention, in which the electrodeposited copper foil 12 is coated with a photoetching resist pattern 22. To form a desired fine circuit pattern on the transfer sheet 10, the electrodeposited copper foil 12 is photoetched.

According to the present invention, the circuit pattern thus obtained is more precise than that obtained by a prior art process in which a similar circuit pattern is formed by photoetching an electrodeposited copper foil on a known printed circuit board (PCB) or a flexible printed circuit (FPC), and the reasons for this will now be given. Note, a circuit-forming transfer sheet was not used to form the PCB or FPC.

Figure 3:
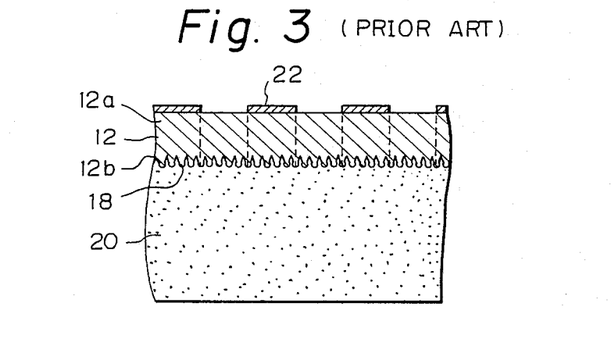
FIG. 3 is a cross-sectional view illustrating a known method for forming a circuit pattern by photoetching.

FIG. 3 shows a known copper-laminated substrate (PCB or FPC) coated with a photoetching resist pattern 22. As shown in FIG. 3, a PCB or FPC is formed in a known process as follows: An electrodeposited copper foil 12, having a smooth surface 12a and a rough surface 12b with a plurality of fine projections 18 is attached to a resin base 20 by the rough surface 12b by thermocompression or by an adhesive, to obtain a copper-laminated substrate which is then photoetched to form a fine circuit pattern on the resin base 20.

As mentioned above, the fine projections 18 of the electrodeposited copper foil 12 protrude into the resin base or sheet 20, and therefore, when the electrodeposited copper foil 12 is photoetched, the etching must be carried out in the portions in which the fine projections 18 exist, and therefore, the etching time is not always the same or the surface is over-etched, and thus a desired precise photoetched pattern cannot be obtained.

Conversely, the transfer sheet 10 according to the present invention is provided with an electrodeposited copper foil 12 having a plurality of fine projections 18 exposed to the outside surface, and therefore, a time for etching the whole of the electrodeposited copper foil 12 through the overall depth thereof is not affected by the time required for etching these fine projections 18. Accordingly, the time for etching from the rough surface 12b to the smooth surface 12a is constant and over-etching is prevented, and thus a desired precisely etched pattern can be obtained, which cannot be expected in the prior art as mentioned above.

As described above, a precise fine circuit pattern can be obtained according to the present invention, and further, usually the smooth surface 12a of the electrodeposited copper foil 12 is covered with the base sheet 14, so that oxidation of the smooth surface 12a is prevented without the need for a particular treatment thereof.

The electrodeposited copper foil 12 can be replaced by any electrodeposited metal foil having a large number of projections similar to the above-mentioned projections 18, and although in the above-mentioned embodiment the electrodeposited copper foil 12 is attached to the base sheet 14 via the exfoliating layer 16, the electrodeposited metal foil 12 may be directly attached to the base sheet 14 by heat soldering or the like and the exfoliating layer 16 omitted.

A process for making a circuit substrate, particularly, a package for mounting semiconductor devices, by using a transfer sheet 10 according to the present invention, will now be described with reference to FIGS. 4A–4C.

First, a desired circuit pattern 28 is formed by photoetching the electrodeposited copper foil 12 of the transfer sheet 10, as mentioned above. Then, as shown in FIG. 4A, the transfer sheet 10 is placed in a metal mold 32 and precisely positioned in such a manner that the base sheet 14 is in contact with an inner wall of a cavity 30 and the rough surface of the electrodeposited copper foil 12, on which the circuit pattern 28 is formed, faces the inside of the cavity 30. A plurality of metal leads 34, for connecting the circuit pattern 28 to external circuits or lines, are also placed in the mold 32 and positioned so that they are in contact with the circuit pattern 28. The circuit pattern 28 is provided with a plurality of holes 36 at positions at which head portions of the metal leads 34 are in contact therewith. These holes 36 serve to facilitate, by supplying a solder therein, the flexed connection of the metal leads 34 to the circuit pattern 28. A heat sink 38 is also placed in the metal mold 32, in a predetermined position, and then a melting resin is poured into the cavity 30 through an inlet port 40 and a molded article 42 as shown in FIG. 4B is obtained.

Figure 4A:
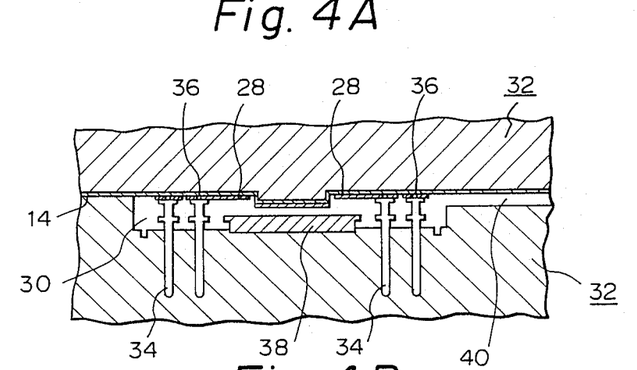
FIGS. 4A-4C are cross-sectional views illustrating a process for making a circuit substrate according to the present invention.
Figure 4B:
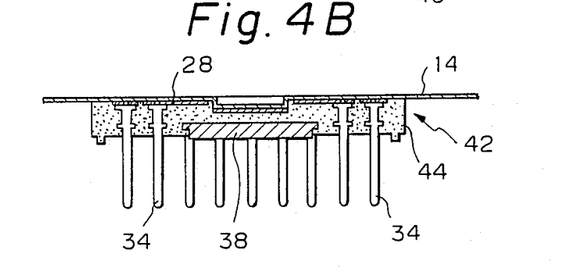
Figure 4C:
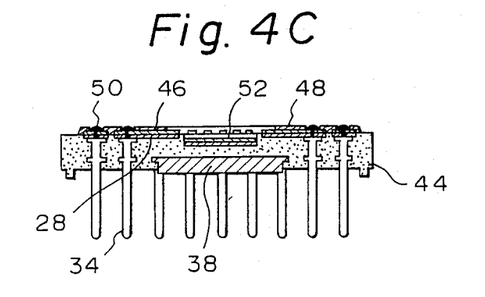

The base sheet 14 is then peeled from the molded article 42, so that the circuit pattern 28 remains on the resin base 44 as shown in FIG. 4C, and the circuit pattern 28 is electroless-plated with a protective layer 46 and further plated with gold or the like to facilitate wire-bonding. Finally, the resin base 44 is coated with a resist film 48 to cover the circuit pattern 28, except for the portions around the above-mentioned holes 36, wire-bonding areas, and an inside surface of a recess 52 for mounting a semiconductor chip (not shown), and a solder is supplied to the holes 36 to fixedly connect the circuit pattern 28 to the metal leads 34.

Thus, as described above, a package for semiconductor devices is obtained in which the circuit pattern 28 is formed on a surface of the resin base 44, the metal leads 34 are electrically connected to the circuit pattern 28, and a heat sink 38 is inserted and integrally molded in the resin base 44.

According to the present invention, the base sheet 14 of the transfer sheet 10 is flexible, so that the transfer sheet 10 can be easily placed along an uneven inner wall of the cavity 30, and therefore, it becomes possible to form a three-dimensional circuit. Accordingly, a circuit pattern also can be formed, for example, on the bottom and/or side walls of the recess 52 for mounting a semiconductor chip, which are at a lower level than the surface of the resin base 44 on which the main circuit pattern 28 is formed.

Figure 5:
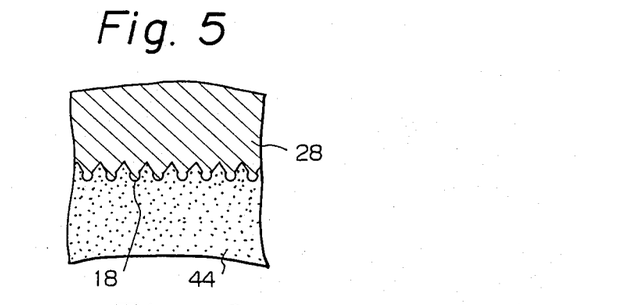
FIG. 5 is a partial cross-sectional view showing the circuit pattern attached to the resin base.

As shown in FIG. 5, the circuit pattern 28 is provided on one surface thereof with a large number of fine projections 18 of the electrodeposited copper foil 12, which are buried in the resin base 44, so that the circuit pattern 28 is rigidly secured to the surface of the resin base 44 by the "anchoring effects" of the fine projections 18. Since the circuit pattern 28 is formed by an electrolysis metal, such as the electrodeposited copper foil 12, a circuit having a low resistance can be obtained, compared with a conventional circuit made from a known electrical conductive paste, and thus a precise fine and heatproof circuit pattern 28 can be obtained.

Figure 6:
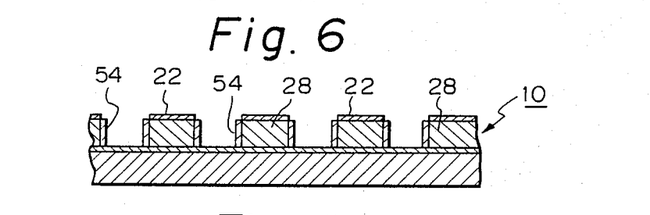
FIG. 6 is a cross-sectional view of a circuit pattern coated with a rust-preventing film.

FIG. 6 shows a second embodiment of this invention. In this embodiment, after a circuit pattern 28 is formed by photoetching the electrodeposited copper foil 12 of the transfer sheet 10, a rust-preventing film 54 is formed by electroless-plating the surface of the transfer sheet 10 on which the circuit pattern 28 is formed. A photoetching resist 22 is removed after the rust-preventing film 54 is formed, and the transfer sheet 10 is then placed in the mold 32 to form a package for mounting semiconductor devices, in the same manner as in the above-mentioned embodiment.

It should be noted that, in the package shown in FIG. 4C, rust preventing effects can be expected, since the circuit pattern 28 is first formed by photoetching and then the side walls of the circuit pattern 28 are covered with the resin base 44. Nevertheless, after the base sheet 14 is peeled from the transfer sheet 10, if moisture enters any gaps that may have been formed between the resin base 44 and the circuit pattern 28, during a wet process such as a nickel electrolessplating process, corrosion of exposed portions of the circuit pattern 28 may occur.

In the embodiment shown in FIG. 6, however, this problem of corrosion can be completely overcome by a prior forming of the above-mentioned rust-preventing film 54 on the exposed side walls of the circuit pattern 28.

Figure 7:
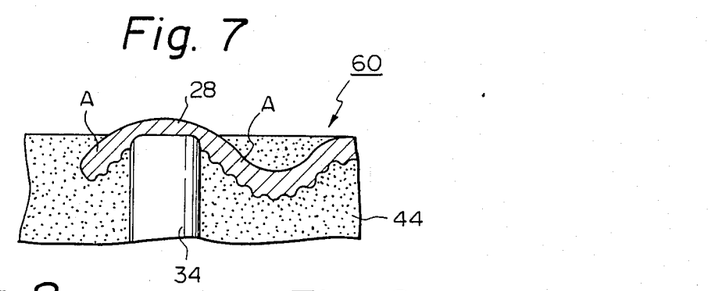
FIG. 7 is a partial cross-sectional view of a circuit pattern under pressure from a metal lead.

FIG. 7 is a partial cross-sectional view illustrating a third embodiment of this invention. In this embodiment, a molded article 60 comprises a circuit pattern 28 which is partially buried in the resin base 44 at the peripheral area of the position at which the circuit pattern 28 is in contact with a metal lead 34. Around this position, a part of the resin base 44 which covers the metal lead 34 urges the circuit pattern 28 into firm contact with the metal lead 34. Also, peeling of the circuit pattern 28 from the resin base 44 at the above-mentioned peripheral area is prevented.

Figure 8:
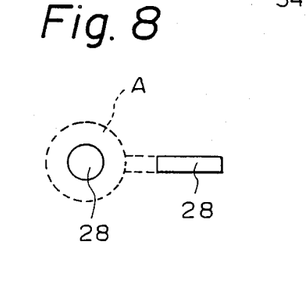
FIGS. 8 and 9 are plan views of FIG. 7.
Figure 9:
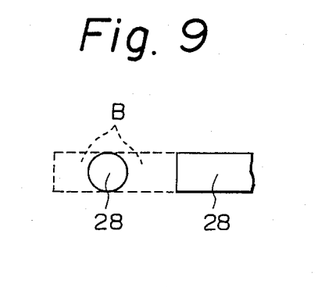

FIGS. 8 and 9 are plan view of FIG. 7. FIG. 8 shows the circular lands A of the circuit pattern 28, with which the metal leads 44 are in contact. Each circular land A has a wide area larger than the width of the head portion of the metal lead 34, and the periphery of this land A around the metal lead 34 is completely buried in the resin base 44. Alternatively, as shown in FIG. 9, the circuit pattern 28 may have a pattern width substantially the same as the width of the metal lead 44, so that the pattern 28 may be buried in the resin base 44 at the respective sides B of the metal lead 34.

Figure 10:
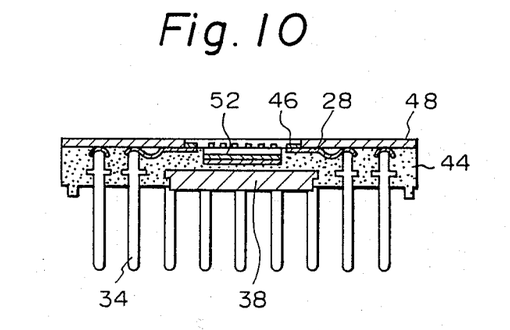
FIG. 10 is a cross-sectional view of a package according to the embodiment shown in FIG. 7.

FIG. 10 is a cross-sectional view of a package for semiconductor devices according to the embodiment of FIG. 7. In FIG. 10, the same or corresponding elements are indicated by the same reference numerals as those of the embodiment shown in FIG. 4C. In FIG. 10, the circuit pattern 28 is buried in the resin base 44 at the periphery of the position at which the circuit pattern 28 is in contact with the metal lead 34, to ensure a firm contact therewith.

A process for forming a package as shown in FIGS. 7 an 10, using a transfer sheet 10 according to the present invention, will now be described with reference to FIGS. 11A and 11B. A plurality of metal leads 34 are placed in the mold 32A, 32B and positioned in such a manner that they are in contact with the circuit pattern 28, in the same manner as in the previous embodiment. In this embodiment, however, the metal leads 34 urge the circuit pattern 28 toward the base sheet 14 to deform it into a convex shape, as shown in FIG. 4A. Consequently, the metal lead 34 has a length such that, when the upper and lower molds 32A and 32B are fitted together, the metal leads 34 urge the circuit pattern 28 upward.

In this embodiment, since the circuit pattern 28 is urged and deformed toward the base sheet 14, the circuit pattern 28 is easily peeled from the exfoliating layer 16 at the periphery of the deformed portion. The reasons for this as follows. When the circuit pattern 28 is urged toward the base sheet 14, the base sheet 14 and the exfoliating layer 16 are also simultaneously deformed. The circuit pattern 28, however, is more easily deformed than the base sheet 14 and the exfoliating layer 16, and therefore, a shearing force is generated between the exfoliating layer 16 and the circuit pattern 28 at the periphery of the portion deformed by the metal lead 34, and the circuit pattern 28 can be easily peeled from the exfoliating layer 16. Alternatively, the thickness of the circuit pattern 28 is reduced at these portions by the urging of the metal leads 34, and these thin portions of the circuit pattern 28 are deformed by the metal leads 34 toward the exfoliating layer 16, so that the circuit pattern 28 can be easily peeled from the exfoliating layer 16 at these portions.

In this state, a melting resin is poured into the cavity 30 through an inlet port 40, in the same manner as mentioned above. In this case, however, the melting resin also enters the portions C (FIG. 11B) in the cavity 30, in which the circuit pattern 28, consisting of a thin electrodeposited copper foil, is peeled from the exfoliating layer 16 and further deformed toward the inside of the cavity by the pressure of the melting resin.

After cooling and solidification, the molded article is removed from the mold 34, and the base sheet 14 is then peeled from the exfoliating layer 16, and therefore, a circuit substrate as shown in FIG. 7 is obtained in the same manner as mentioned above.

Figure 11A:
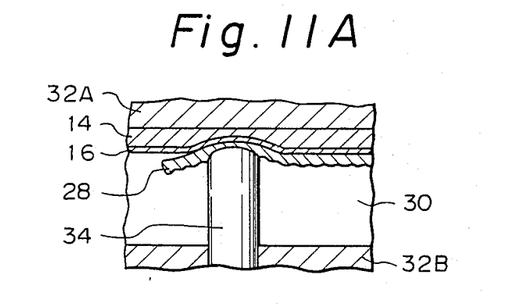
FIGS. 11A and 11B are cross-sectional views, illustrating a process for forming a circuit substrate shown in FIG. 7.
Figure 11B:
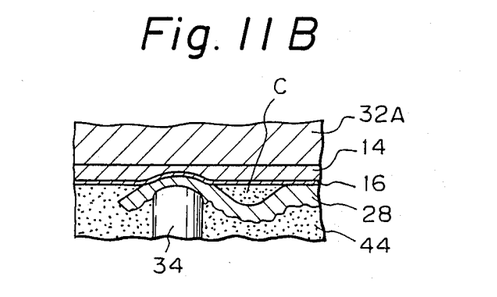
Figure 12:
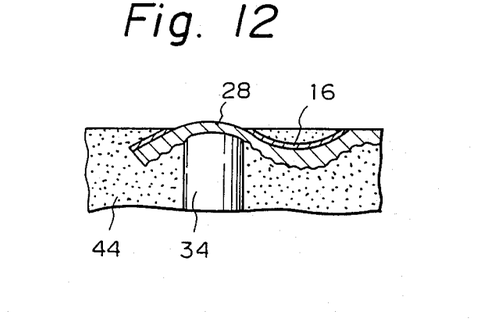
FIG. 12 is a partial cross-sectional view similar to FIG. 7.

FIG. 12 shows another package similar to the embodiment shown in FIG. 7. In this embodiment, however, the exfoliating layer 16 is accompanied by the circuit pattern 28 when peeled from the base sheet 14 (FIGS. 11A and 11B). This is made possible by adjusting an adhesive strength of the exfoliating layer 16. In this case, the exfoliating layer 16 on the circuit pattern 28 is also deformed at the periphery of the metal lead 34 and buried in the resin base 44. This, however, will not cause any problems.

Figure 13A:
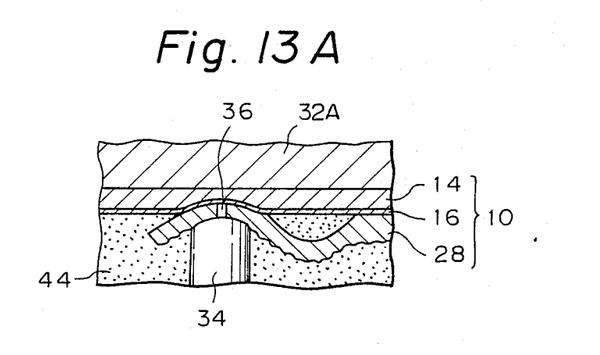
FIGS. 13A and 13B are cross-sectional views similar to FIGS. 11A and 11B, illustrating another process for forming a circuit substrate.
Figure 13B:
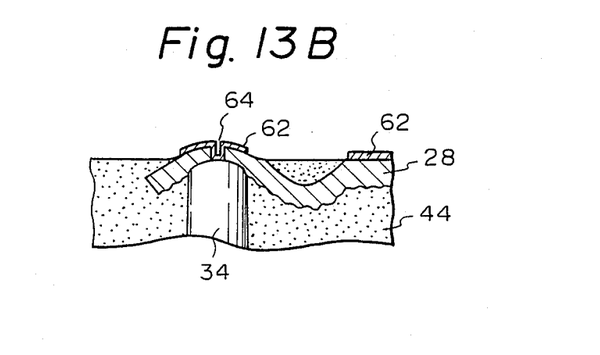

FIGS. 13A and 13B are cross-sectional views showing a modification of the embodiment shown in FIGS. 11A and 11B. Similar to the embodiment shown in FIGS. 4A-4C, the circuit pattern 28 is provided with a plurality of holes 36 at the positions at which the metal leads 34 urge and deform the circuit pattern 28. After the base sheet 14 and the exfoliating layer 16 are peeled from the molded article, the circuit pattern 28 is plated with a protective layer 64 by electrolessplating the circuit pattern 28 with gold or the like. The plated layer 64 serves to fixedly connect the circuit pattern 28 to the metal leads 34.

Figure 14A:
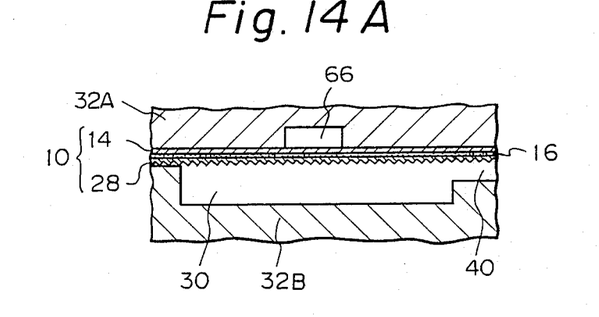
FIGS. 14A-14C are cross-sectional views, similar to FIGS. 4A-4C, respectively, illustrating still another process for forming, a circuit substrate according to the present invention.
Figure 14B:
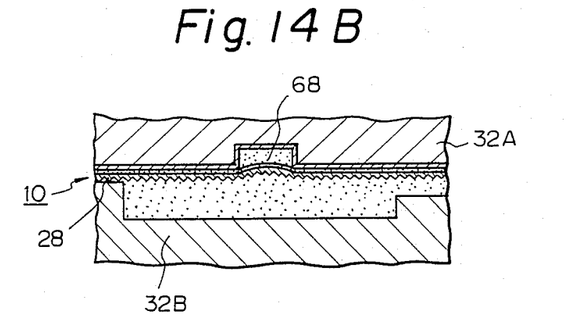
Figure 14C:
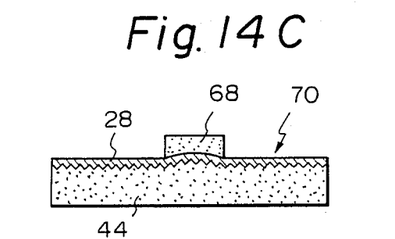

FIGS. 14A-14C are cross-sectional views substantially corresponding to FIGS. 4A-4C, respectively, but showing still another embodiment of this invention. In this embodiment, the upper mold 32a with which the transfer sheet 10 is placed in contact has a central recess 66 having a predetermined shape (FIG. 14A). Therefore, when the cavity 30 is filled with a melting resin, the transfer sheet 10 is deformed toward the inside of the recess 66 by the pressure of the melting resin. An extension rate of the base sheet 14 depends on that of the material itself, but is usually 120 to 200%, which is significantly larger than that of the electrodeposited copper foil 12, which is usually 3 to 5%. Thus, the circuit pattern 28 is slightly deformed toward the recess 66, but the extension of the circuit pattern 28 is stopped at a predetermined point. Conversely, the base sheet 14 is further deformed into the inside of the recess 66, and therefore, peeled from the circuit pattern 28. The melting resin is fed into the recess 66 until the base sheet 14 finally comes into tight contact with the inner wall of the recess 66, so that the projection 68 is formed and the circuit pattern 28 thereunder is buried in the resin base 44 (FIG. 14B). Subsequently, the molded article is removed from the mold 32A and 32B and subjected to the treatments needed to obtain a circuit substrate 70 as shown in FIG. 14C.

Figure 15:
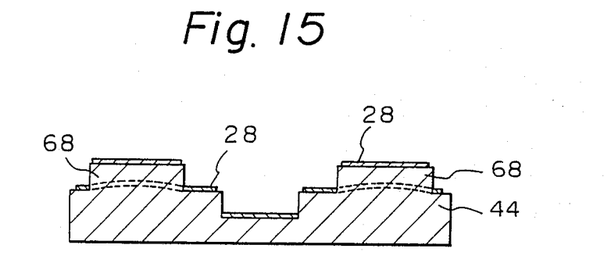
FIG. 15 is a cross-sectional view of still another package formed according to the present invention.

In such a thus-obtained circuit substrate 70, additional circuit patterns 28 also can be formed on the upper surfaces of the projections 68 integrally molded with the resin base 44, as shown in FIG. 15.

Figure 16A:
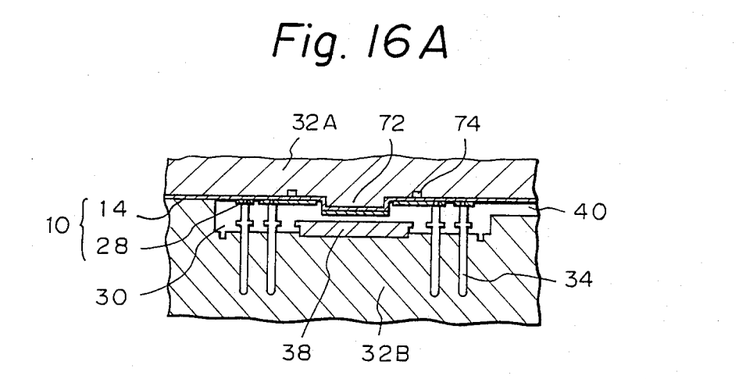
FIGS. 16A and 16B are cross-sectional views similar to FIGS. 14A and 14B, respectively; and, FIGS. 17A–17C are cross-sectional views corresponding to FIGS. 14A–14C, respectively, illustrating a still further embodiment of a process for forming a circuit substrate.
Figure 16B:
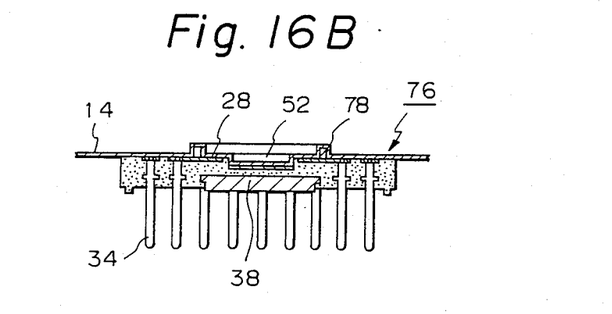

FIGS. 16A and 16B are cross-sectional views corresponding to FIGS. 4A and 4B, respectively, but illustrating a process for making a package 76 similar to that shown in FIG. 15. In FIGS. 16A and 16B, the same or corresponding elements are indicated by the same reference numerals as those of the embodiment shown in 4A-4C. Reference numeral 72 (FIG. 16A) denotes a projection of the upper mold 32A for forming a recess 52 (FIG. 16B) for mounting a semiconductor chip (not shown), and 74 denotes a groove provided in the upper mold 32A for forming a dam frame 78. After the base sheet 14 is peeled from the molded article, a package 76 is finally obtained having such a dam frame 78, which serves as a welding area of welding a sealing cap (not shown) to the package 76.

In the molding process, preferably the transfer sheet 10 is firmly held at a predetermined position in the upper mold 32A by a vacuum force exerted from the inside of the upper mold 32A, when the transfer sheet 10 is set in the cavity 30.

Figure 17A:
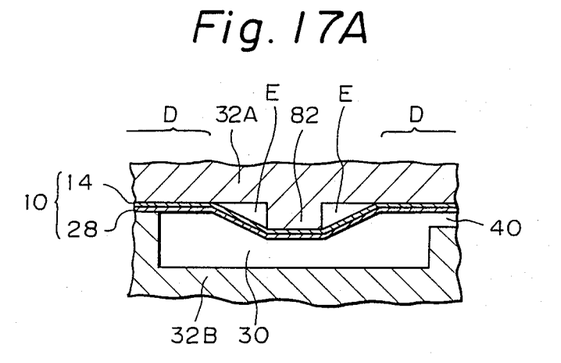
Figure 17B:
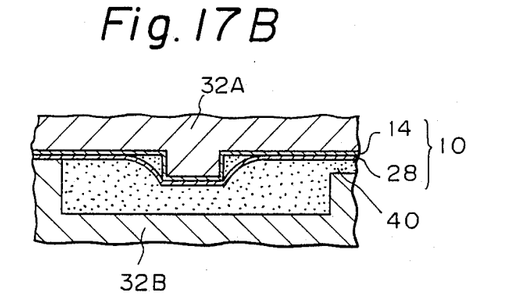
Figure 17C:
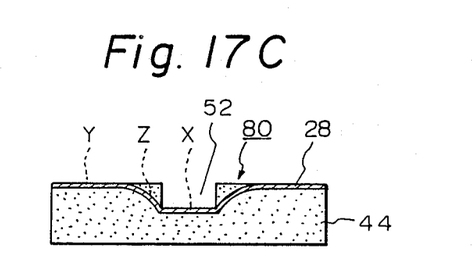

FIGS. 17A-17C are cross-sectional views corresponding to FIGS. 14A-14C, respectively, but showing a further modified embodiment. In this embodiment, the upper mold 32A, with which the transfer sheet 10 is placed in contact, has a central projection 82 having a predetermined shape. Therefore, when the transfer sheet 10 is placed in a predetermined position in the cavity 30, the transfer sheet 10 is deformed, as shown, by the projection 82.

When the transfer sheet 10 is placed in the cavity 30, preferably the periphery of the transfer sheet 10 is firmly held between the upper and lower molds 32A and 32B, or the transfer sheet 10 is firmly held on the inner wall of the upper mold 32A with the help of a vacuum force exerted from the upper molds 32. For example, a vacuum force can be applied from a region D so that the transfer sheet 10 is firmly held on the upper molds 32 to define a space E between the projection 82 and the region D and between the transfer sheet 10 and the inner wall of the cavity 30.

When the cavity 30 is filled with a melting resin, the transfer sheet 10 is deformed toward the space E by the pressure of the melting resin in such a manner that the base sheet 14 is peeled from the circuit pattern 28. The melting resin is fed into the space E until the base sheet 14 finally comes completely into contact with the projection 82 and the inner wall of the cavity 30, so that the space E is completely filled with the melting resin. On the other hand, the circuit pattern 28 is buried in the resin base 44, in the same manner as mentioned above. The molded article is removed from the mold 32A, 32B and then subjected to the treatments needed to obtain a package 80 having a recess 52, as shown in FIG. 17C, accordingly, in this embodiment, portions Z of the circuit pattern 28 for connecting pattern portions X formed on the bottom of the chip mounting recess 52 to pattern portions Y formed on the resin base 44 are buried in the resin base 44.

We claim:

1. A process for making a circuit substrate, using a transfer sheet in which an electrodeposited metal foil, having a smooth surface and a rough surface provided with a large number of fine projections is attached to a heatproof flexible base sheet in such a manner that said smooth surface of said electrodeposited metal foil is in contact with said base sheet said electrodeposited metal foil is exfoliatively secured to said base sheet; said process comprising the following step of:

etching said electrodeposited metal foil to form a circuit pattern on said base sheet of the transfer sheet wherein said metal foil has said plurality of fine projections exposed at an outside surface to facilitate a constant time for etching from said rough surface to said smooth surface, whereby over-etching is prevented;

placing said transfer sheet into a cavity of a mold in such a manner that said rough surface of said circuit pattern faces an inside of said mold cavity;

pouring a melting resin into said mold cavity to form a molded article comprising a resin base to which said transfer sheet is attached; and, peeling said transfer sheet from said molded article, so that said circuit pattern remains on said resin base.

2. A process as set forth in claim 1, wherein said electrodeposited metal foil is etched by photoetching.

3. A process for making a circuit substrate, using a transfer sheet in which an electrodeposited metal foil having a smooth surface and a rough surface provided with a large number of fine projections is attached to a heatproof flexible base sheet in such a manner that said smooth surface of said electrodeposited metal foil is in contact with said base sheet and said electrodeposited metal foil is exfoliatively secured to said base sheet; said process comprising the following steps of:

etching said electrodeposited metal foil to form a circuit pattern on said base sheet of the transfer sheet wherein said metal foil has said plurality of fine projections exposed at an outside surface to facilitate a constant time for etching from said rough surface to said smooth surface, whereby over-etching is prevented;

forming a rust-preventing film on at least a surface of said transfer sheet on which said circuit pattern is formed;

placing said transfer sheet into a cavity of a mold in such manner that said rough surface of said circuit pattern faces an inside of said mold cavity;

pouring a melting resin into said mold cavity to form a molded article comprising a resin base to which said transfer sheet is attached; and, peeling said transfer sheet from said molded article, so that said circuit pattern remains on said resin base.

4. A process as set forth in claim 3, wherein said rust-preventing film is formed by electrolessplating.

5. A process as set forth in claim 3, wherein said electrodeposited metal foil is etched by photoetching.

6. A process for making a circuit substrate, using a transfer sheet in which an electrodeposited metal foil having a smooth surface and a rough surface provided with a large number of fine projections is attached to a heatproof, flexible base sheet in such a manner that said smooth surface of said electrodeposited metal foil is in contact with said base sheet and said electrodeposited metal foil is exfoliatively secured to said base sheet; said process comprising the following steps of:

etching said electrodeposited metal foil to form a circuit pattern on said base sheet of the transfer sheet wherein said metal foil has said plurality of fine projections exposed at an outside surface to facilitate a constant time for etching from said rough surface to said smooth surface, whereby over-etching is prevented;

placing said transfer sheet into a cavity of a mold in such a manner that said rough surface of said circuit pattern faces an inside of said mold cavity;

placing insert metals into said mold in such a manner that said insert metals are positioned to come into contact with said circuit pattern of said transfer sheet;

pouring a melting resin into said mold cavity to form a molded article comprising a resin base to which said transfer sheet is attached; and, peeling said transfer sheet from said molded article, so that said circuit pattern remains on said resin base.

7. A process as set forth in claim 1, wherein said insert metals are metal leads for connecting said circuit pattern to external circuits or lines.

8. A process as set forth in claim 7, wherein said circuit pattern of said transfer sheet is provided with holes at positions at which said metal leads are in contact therewith, and after said transfer sheet is peeled from said molded article, a solder is supplied to said holes to fixedly connect said metal leads to said circuit pattern on said resin base.

9. A process as set forth in claim 6, wherein said mold comprises a first half and a second half, and said insert metals have sizes such that, when said first and second halves of the mold are set in position, said insert metals urge the circuit pattern toward the base sheet of the transfer sheet to deform the circuit pattern in such a manner that a peripheral area of a portion thereof, in which the circuit pattern is in contact with said insert metal, is buried in said resin base.

10. A process as set forth in claim 6, wherein said electrodeposited metal foil is etched by photoetching.

11. A process for making a circuit substrate, using a transfer sheet in which an electrodeposited metal foil having a smooth surface and a rough surface provided with a large number of fine projections is attached to a heatproof flexible base sheet in such a manner that said smooth surface of said electrodeposited metal foil is in contact with said base sheet and said electrodeposited metal foil is exfoliatively secured to said base sheet; said process comprising the following steps of:

etching said electrodeposited metal foil to form a circuit pattern on said base sheet of the transfer sheet wherein said metal foil has said plurality of fine projections exposed at an outside surface to facilitate a constant time for etching from said rough surface to said smooth surface, whereby over-etching is prevented;

placing said transfer sheet into a cavity of a mold in such a manner that said rough surface of said circuit pattern faces an inside of said mold cavity, said mold having a projection or recess on a cavity wall with which said transfer sheet is in contact;

pouring a melting resin into said mold cavity so that a part of said base sheet is deformed and separated from said circuit pattern to come into contact with a wall of said projection or recess by a pressure of the melting resin, to make a molded article comprising a resin base to which said transfer sheet is attached in such a manner that a part of said circuit pattern is buried in said resin base; and, peeling said transfer sheet from said molded article, so that said circuit pattern remains on and in said resin base.

12. A process as set forth in claim 11, wherein said electrodeposited metal foil is etched by photoetching.

13. A process for making a circuit substrate, using a transfer sheet in which an electrodeposited metal foil having a smooth surface and a rough surface provided with a large number of fine projections is attached to a heatproof, flexible base sheet in such a manner that said smooth surface of said smooth surface of said electrodeposited metal foil is in contact with said base sheet and said electrodeposited metal foil is exfoliatively secured to said base sheet; said process comprising the following steps of:

etching said electrodeposited metal foil to form a circuit pattern on said base sheet of the transfer sheet;

placing said transfer sheet into a cavity of a mold in such a manner that said rough surface of said circuit pattern faces an inside of said mold cavity;

placing insert metals into said mold in such a manner that said insert metals are positioned to come into contact with said circuit pattern of said transfer sheet;

pouring a melting resin into said mold cavity to form a molded article comprising a resin base to which said transfer sheet is attached; and, peeling said transfer sheet from said molded article, so that said circuit pattern remains on said resin base, wherein said mold comprises a first half and a second half, and said insert metals have sizes such that, when said first and second halves of the mold are set in position, said insert metals urge the circuit pattern toward the base sheet of the transfer sheet to deform the circuit pattern in such a manner that a peripheral area of a portion thereof, in which the circuit pattern is in contact with said insert metal, is buried in said resin base.

14. A process as set forth in claim 13, wherein said insert metals are metal leads for connecting said circuit pattern to external circuits or lines.

15. A process as set forth in claim 14, wherein said circuit pattern of said transfer sheet is provided with holes at positions at which said metal leads are in contact therewith, and after said transfer sheet is peeled from said molded article, a solder is supplied to said holes to fixedly connect said metal leads to said circuit pattern on said resin base.

16. A process as set forth in claim 13, wherein said electrodeposited metal foil is etched by photoetching.

* * * * *